(12) United States Patent
Jung

(10) Patent No.: US 7,696,449 B2
(45) Date of Patent: Apr. 13, 2010

(54) SILICON CRYSTALLIZING DEVICE

(75) Inventor: Yun Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 615 days.

(21) Appl. No.: 11/015,015

(22) Filed: Dec. 20, 2004

(65) Prior Publication Data

US 2005/0139151 A1 Jun. 30, 2005

(30) Foreign Application Priority Data

Dec. 26, 2003 (KR) .................. 10-2003-0097586

(51) Int. Cl.
*B23K 26/00* (2006.01)
(52) U.S. Cl. .................. 219/121.65; 219/121.78; 219/121.8
(58) Field of Classification Search ............ 219/121.65, 219/121.78, 121.8
See application file for complete search history.

(56) References Cited

U.S. PATENT DOCUMENTS

| | | | |
|---|---|---|---|
| 6,368,945 B1 * | 4/2002 | Im | 438/487 |
| 6,635,554 B1 * | 10/2003 | Im et al. | 438/482 |
| 6,680,460 B1 * | 1/2004 | Takaoka et al. | 219/121.73 |
| 6,861,614 B1 * | 3/2005 | Tanabe et al. | 219/121.66 |
| 6,961,117 B2 * | 11/2005 | Im | 355/67 |
| 7,164,152 B2 * | 1/2007 | Im | 257/64 |

FOREIGN PATENT DOCUMENTS

| KR | 1020010062714 | 7/2001 |
|---|---|---|
| KR | 1020030042429 | 5/2003 |

OTHER PUBLICATIONS

Communication from Korean Patent Office dated Oct. 27, 2005.
Robert S. Sposilli, M. A. Crowder, and James S. Im, "Single-Crystal Si Films Via a Low-Substrate-Temperature Excimer-Laser Crystallization Method," Columbia University, Department of Chemical Engineering, Materials Science, and Mining Engineering, New York, NY 10027, vol. 452, pp. 956-957, 1997.

* cited by examiner

*Primary Examiner*—M. Alexandra Elve
(74) *Attorney, Agent, or Firm*—McKenna Long & Aldridge LLP

(57) ABSTRACT

A silicon crystallizing device includes a laser beam source emitting a laser beam, a projector unit converging and changing a pattern of the laser beam from the laser beam source, a stage loading/unloading a substrate, a mirror deflecting the laser beam from the projector unit to an outside of the substrate, and a cooling device receiving the laser beam deflected by the mirror and sinking heat generated by the laser beam received, thereby warming up the projection lens before completion of loading the substrate, or cutting off laser beam incident on the substrate after crystallization of the substrate.

6 Claims, 7 Drawing Sheets

SILICON CRYSTALLIZING DEVICE

This application claims the benefit of Korean Application No. P2003-97586 filed on Dec. 26, 2003, which is hereby incorporated by reference.

BACKGROUND OF THE INVENTION

1. Field of the Invention

The present invention relates to silicon crystallization, and more particularly, to a silicon crystallizing device. Although the present invention is suitable for a wide scope of applications, it is particularly suitable for preventing non-uniform crystallization of silicon due to variation of a focal length caused by temperature variation of a projection lens which determines a laser beam pattern.

2. Discussion of the Related Art

With development of information technology, flat display devices in various forms are in great demand. For example, LCDs (liquid crystal displays), PDPs (plasma display panels), ELDs (electro luminescent displays), VFDs (vacuum fluorescent displays), have been researched and developed as monitors for various apparatuses. Recently, the LCDs have attracted considerable attention because of good picture quality, light weight, thin profile, and low power consumption. As a substitute for a CRT (cathode ray tube), the LCD may be utilized as a mobile display for a notebook computer, a television receiver set for receiving and displaying a broadcasting signal, or the like.

Such an LCD includes a liquid crystal panel for displaying a picture, and a driving unit for applying a driving signal to the liquid crystal panel, wherein the liquid crystal display panel is provided with two glass substrates: a TFT array substrate and a color filter substrate, and a liquid crystal layer sandwiched between the two glass substrates.

On the TFT array substrate, a plurality of gate lines are arranged at regular intervals in one direction, a plurality of data lines are arranged perpendicular to the gate lines at regular intervals, a plurality of pixel electrodes are respectively formed on pixel regions defined by the gate lines and the data lines crossing each other in a matrix form, and a plurality of thin film transistors are formed to switch in response to a gate line signal for transmission of a data line signal to each pixel electrode. On the color filter substrate, a black matrix layer is formed for shielding a light incident on parts excluding the pixel regions, R, G, B color filter layers are formed for expressing colors, and a common electrode is formed for reproducing a picture. Moreover, the two glass substrates are made to have a gap therebetween by means of spacers, and bonded together with a sealant having a liquid crystal injection hole, through which a liquid crystal material is injected into the gap.

A general driving principle of the LCD device employs an optical anisotropy and polarity of liquid crystals. Molecules of the thin and elongated liquid crystals tend to orient, and thus enable to control orientation of the molecules by applying an electric field to the liquid crystals as intended. Therefore, if the orientation of liquid crystal molecules is changed, light is refracted accordingly by the optical anisotropy to express picture information. Currently, the active matrix LCD is the most attractive because of its good resolution and motion picture reproduction capability, in which thin film transistors and pixel electrodes connected thereto are arranged in a matrix form.

In the LCD, a semiconductor layer of the thin film transistors is formed of polycrystalline silicon (polysilicon). The thin film transistors and the driving circuit may be formed on the same substrate, which can dispense with a step for connecting the thin film transistors and the driving circuit, thereby simplifying a fabrication process. Moreover, since the polysilicon has a field effect mobility greater than amorphous silicon by 100 to 200 times, the polysilicon has a fast response speed and is stable to temperature and light.

The polysilicon may be formed either by a low temperature process or by a high temperature process. Because the high temperature process is disadvantageous in that a process temperature, which is about 1000° C., for example, and higher than a deformation temperature of an insulating substrate, requires use of an expensive quartz substrate. The quartz substrate has a heat resistance higher than the glass substrate, the low quality crystal with poor surface roughness, and fine crystal grain size that leads to have a poorer applicability than the polysilicon formed by the low temperature process. Research and development are conducted to deposit amorphous silicon at a low temperature and crystallize it to form the polysilicon.

The low temperature process includes laser annealing, metal induced crystallization, and the like. In the laser annealing, a pulse form of a laser beam is directed to the substrate to repeat melting and solidification in $10\sim10^2$ nano seconds, thereby minimizing damages to a lower insulating substrate. A related art silicon crystallizing device will be described with reference to the attached drawings, in which a laser beam is directed to a substrate to progress crystallization of the substrate.

FIG. 1 is a graph illustrating a relationship between amorphous silicon grain size and laser energy intensity. As shown in FIG. 1, crystallization of the amorphous silicon may be divided into first, second, and third regions according to intensities of the laser energy.

The first region is a partial melting region in which the laser beam is directed to the amorphous silicon layer at an intensity of laser energy only to melt a surface of the amorphous silicon layer, thereby forming fine crystal grains in the surface of the amorphous silicon layer through partial melting and solidification. The second region is a near-complete melting region in which the laser beam is directed to the amorphous silicon layer at an intensity of laser energy higher than the first region to melt almost all the amorphous silicon layer, thereby obtaining crystal grains grown more than the first region by growing crystals using fine nuclei remained after the melting as seeds. However, it is difficult to obtain uniform crystal grains. The second region has a width substantially smaller than the first region. The third region is a complete melting region in which the laser beam is directed to the amorphous silicon layer at an intensity of laser energy higher than the second region to melt all the amorphous silicon layer, enough to solidify to progress homogeneous nucleation, leading to obtain a crystalline silicon layer of fine and uniform crystal grains.

In the process of forming the polysilicon, the number of applications and an overlap ratio of the laser beam with an energy intensity of the second region are controlled to form uniform and coarse crystal grains. However, the polysilicon shows some problems in that boundaries of the plurality of crystal grains of the polysilicon impede current flow, making fabrication of a reliable thin film transistor device difficult, the collision currents are formed from the collision between electrons in the plurality of crystal grains, and the degradation damages an insulating film, resulting in defects in products. In order to resolve these problems, research and development are conducted to form single crystal silicon by using an SLS (sequential lateral solidification) technology in which a silicon crystal grain grows from a boundary surface of liquid silicon and solid silicon perpendicular to the boundary surface (Robert S. Sposilli, M. A. Crowder, and James S. Im, Mat. Res. Soc. Symp. Proc. Vol. 452, 956~957, 1997). In the SLS technology, by appropriately controlling intensity, area of application and a translation distance of the laser beam, to grow a silicon crystal grain in a lateral direction by a predetermined length, amorphous silicon can be crystallized to single crystal larger than 1 µm.

A laser applying device for the SLS process cannot convert an amorphous silicon layer on a large area of a substrate into the polysilicon at a same time, because the device focuses the laser beam onto a small area. For this reason, after a substrate having the amorphous silicon layer is loaded on a stage such that a laser application position on the substrate may be changed, the laser beam is applied to the entire area of the substrate by applying the laser beam to a predetermined area of the substrate and then moving the substrate to apply the laser beam to the next area.

FIG. 2 is a view schematically illustrating a related art SLS laser applying device. As shown in FIG. 2, the related art SLS laser applying device includes a laser emitting device (not shown) for emitting a laser beam, an attenuator 1 for controlling an intensity of laser beam energy to attenuate the intensity, a first mirror 2a for changing a path of the laser beam, a telescopic lens 3 for diverging the laser beam, a second mirror 2b for changing the path of the laser beam again, a homogenizer and condenser lens 4 for homogenizing and converging the laser beam, a third mirror 2c for deflecting and changing the path of the laser beam, a field lens 5 for appropriate change of a form of the laser beam to a level enough to incident on a laser beam pattern mask, a laser beam pattern mask 6 having a pattern for passing the laser beam in a predetermined pattern, a projection lens 7 for converging the laser beam from the laser beam pattern mask 6 at a converge ratio and applying to the substrate, and a stage 8 for holding a substrate 10 having amorphous silicon to be crystallized deposited thereon.

The laser emission device is an Excimer Laser of 308 nm XeCl or 248 nm of KrF, which emits an unprocessed laser beam passing the attenuator 1, the mirrors 2a, 2b and 2c, the lenses 3-5 and 7 of various functions, and the laser beam pattern mask 6, to incident on the substrate 10 in a predetermined laser beam pattern. The mirrors 2a, 2b, and 2c are provided to prevent the SLS laser applying device from being elongated in one direction and to use a space effectively. If necessary, the number of the mirrors may be adjusted to increase or decrease the space the SLS laser applying device occupies. Though not shown, there is a fastening means for fastening the stage 8, and a moving means for moving the stage 8. That is, in order to crystallize the entire area of the substrate 10, the laser beam is applied to the substrate 10 while fine movements of the stage 8 in an X-axis, and Y-axis directions are conducted to gradually expand the crystallized area.

FIG. 3 is a graph illustrating a relationship between temperature variation and focal length variation measured at the projection lens 7 in FIG. 2. The projection lens 7 has a plurality of lenses of quartz with 99% or more transmittivity arranged in a shape of a barrel. The projection lens 7 has a predetermined pattern of the laser beam incident thereon through the laser beam pattern mask 6 (of FIG. 2), converges the pattern of the laser beam, and directs to the substrate 10 (of FIG. 2). However, as shown in FIG. 3, since the projection lens 7 is involved in linear elongation of a focal length according to a temperature, it is required that no deviation of the focal length be generated at the time of crystallization by maintaining the projection lens 7 at a predetermined temperature in the crystallization when the laser beam pattern is applied in an order of µm level.

Particularly, as shown in FIG. 3, since a deviation of the focal length in a range of ±20~40 µm is generated by a temperature difference of ±1° C. at an X° C. at which there is no deviation of the focal length, it is required to warm-up the projection lens 7 up to a preset temperature before the crystallization is progressed so as to obtain regular crystallization characteristics. For an example, when the projection lens 7 at the time of loading/unloading the substrate 10 has a temperature lower than a temperature of the projection lens 7 at the time of regular crystallization, the focal length may become shorter during the time the substrate 10 is unloaded from the stage 8 (of FIG. 2) after the crystallization, or the substrate 10 is loaded on the stage 8 before the crystallization, If the crystallization is made before the projection lens 7 is restored to the regular crystallization temperature after the loading of the substrate 10, the regular crystallization cannot be realized due to incorrect focal length at an initial stage. The related art silicon crystallizing device is not provided with an element, which can prevent an unintended formation of a beam overlap area on the substrate 10 having the crystallization completed at the time when the laser beam pattern is applied through the projection lens 7 before unloading of the substrate 10 and after the crystallization of the substrate 10.

The laser beam pattern mask 6 is provided with a pass through portion for passing the laser beam, and a shielding portion for shielding the laser beam. A width of the pass through portion defines a length of lateral growth of a grain for one time of exposure. Also, the laser beam pattern mask 6, and the area of the substrate 10 having the laser beam applied thereto through the laser beam pattern mask 6 will be described in detail, with reference to the attached drawings.

FIG. 4 is a plan view illustrating the laser beam pattern mask 6 for application of a laser beam, and FIG. 5 is a view illustrating a crystallized area formed by one time application of the laser beam by using the laser beam pattern mask 6 in FIG. 4. As shown in FIG. 4, the laser beam pattern mask 6 is provided with a pass through portion 'A' having a pattern opened at first intervals 'a', and a shielding portion 'B' having a pattern shielded at second intervals 'b'.

The laser beam is applied by using the laser beam pattern mask 6 as follows. The laser beam is applied, for one time, to an upper portion of a substrate having an amorphous silicon layer deposited thereon through the laser beam pattern mask 6. Herein, the laser beam passes through a plurality of pass through portions 'A' in the laser beam pattern mask 6, and melts portions 22 (in FIG. 5) of the amorphous silicon layer onto which the laser beam is incident to liquefy the portion in correspondence to the pass through portions 'A'. The intensity of the laser energy used in this case is a complete melting region in which the portions of the amorphous silicon layer, having the laser beam applied thereto, completely melts.

A region of the substrate having the laser beam applied thereto by one time of application of the laser beam in correspondence to a region of the laser beam pattern mask having a plurality of successive pass through portions 'A' (that is, a region defined by a width L and a height S) is called as a unit region 20 as shown in FIG. 5. After application of the laser beam, growth of silicon grains is progressed from boundary surfaces 21a and 21b of the amorphous silicon region and a liquid silicon region melt completely toward laser applied regions in a lateral direction. The lateral growth of the grains 24a and 24b is perpendicular to the boundary surfaces.

If a width of the portion 22 having the laser beam applied thereto in correspondence to the pass through portion 'A' is shorter than a growth length of the crystallized silicon grain 24a, the opposite grains, grown inwardly from and perpendicular to opposite interfaces 21a and 21b of the amorphous silicon region and the portion 22, collide at a middle point (grain boundary 25) to stop the grain growth.

Next, in order to grow more silicon grain, the stage having the substrate placed thereon is moved, and the laser beam is applied to a region next to the laser beam applied portion, to form crystals continuous from the crystals formed at the first time laser beam application. Similarly, the laser beam applied portion melt completely and instantly at the time of the laser beam application has the grain growth from opposite sides in a lateral direction. In general, a length of the grain growth continuous from an adjacent laser beam applied portion progressed as a general laser beam application process is fixed according to widths of the pass through portion "A", and the shielding portion "B" of the laser beam pattern mask.

The foregoing related art silicon crystallizing device has the following problems. The variation of the focal length of the projection lens with a temperature in the related art silicon crystallizing device leads to require a warming up to a predetermined level at the time of crystallization when the laser beam application is required at a precision in an order of a few μm before progressing crystallization. Therefore, as a method of the warming up, a dummy laser shot may be made before the crystallization to elevate the temperature of the projection lens to a level higher than a predetermined level. However, this causes a problem of reduced productivity in that a laser beam application time period is reduced, or the glass having the dummy laser shot applied thereto cannot be used.

Alternatively, the variation of the focal length of the projection lens with a temperature is predicted in advance, to compensate for the variation of the focal length by changing a distance (Z-axis) between the projection lens and the substrate as much as a deviation. However, this requires a very complicate silicon crystallizing device.

SUMMARY OF THE INVENTION

Accordingly, the present invention is directed to a silicon crystallizing device that substantially obviates one or more problems due to limitations and disadvantages of the related art.

An object of the present invention is to provide a silicon crystallizing device that is capable of maintaining a temperature of a projection lens constant by applying a laser beam to the projection lens even in loading/unloading of the substrate.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described, the silicon crystallizing device includes a laser beam source emitting a laser beam, a projector unit converging and changing a pattern of the laser beam from the laser beam source, a stage loading/unloading a substrate, a laser beam shutter deflecting the laser beam from the projector unit to an outside of the substrate, and a cooling device receiving the laser beam deflected by the laser beam shutter and sinking heat generated from the laser beam received.

In another aspect, the silicon crystallizing device includes a laser beam source emitting a laser beam, a projector unit converging and changing a pattern of the laser beam from the laser beam source, a stage loading/unloading a substrate, a mirror deflecting the laser beam from the projector unit to an outside of the substrate, and a cooling device receiving the laser beam deflected by the mirror and sinking heat generated from the laser beam received.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
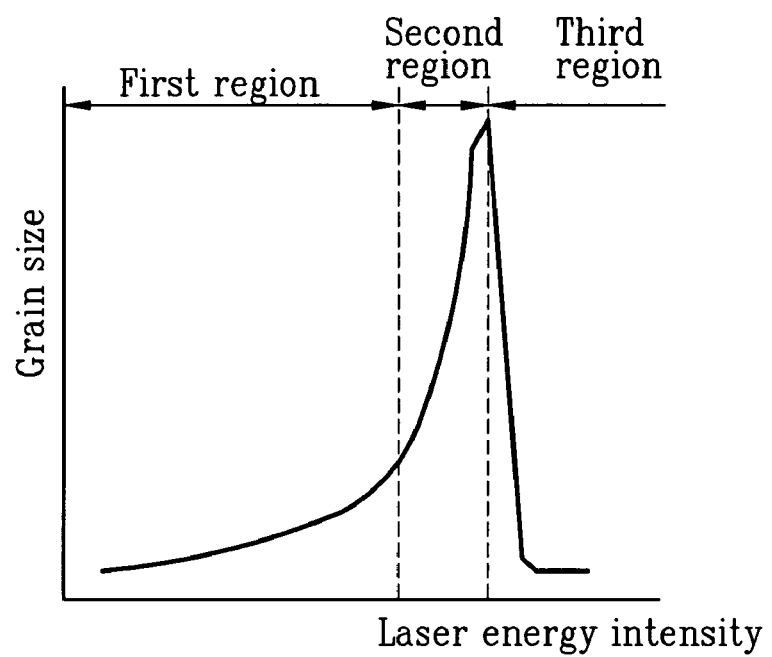
FIG. 1 is a graph illustrating a relationship between amorphous silicon grain size and laser energy intensity.
Figure 2:
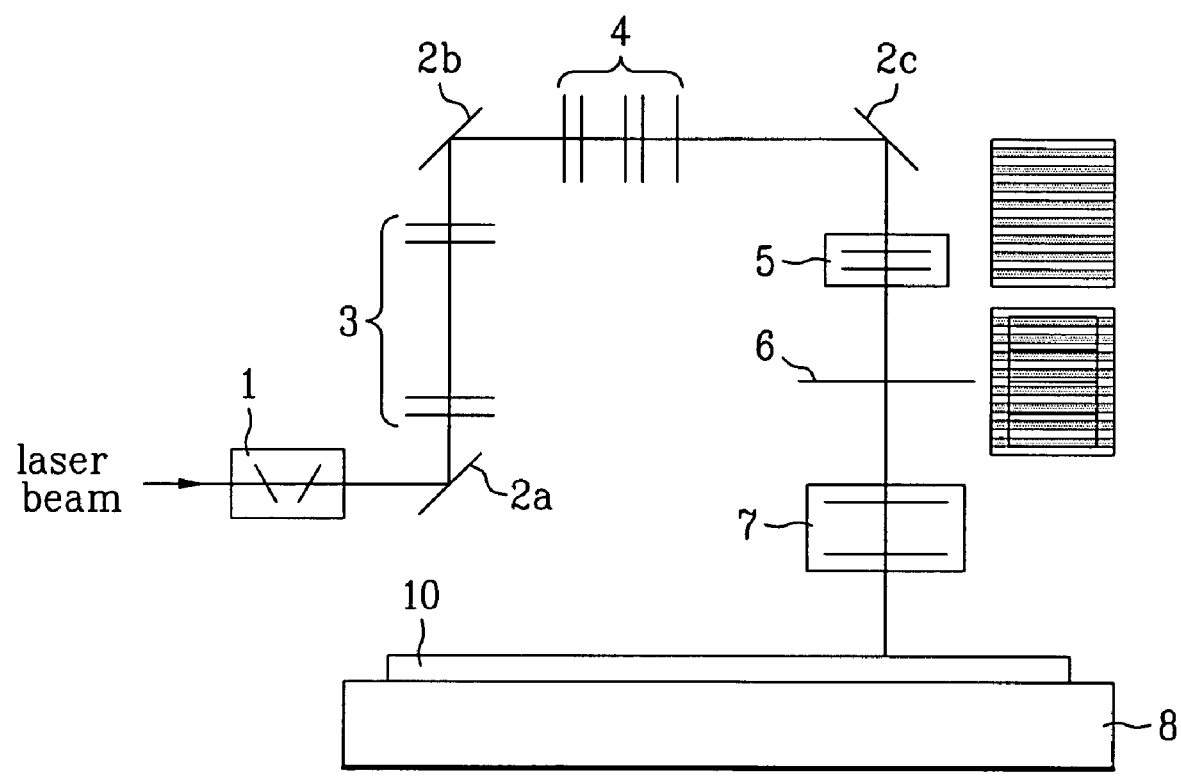
FIG. 2 is a view schematically illustrating a related art SLS laser applying device.
Figure 3:
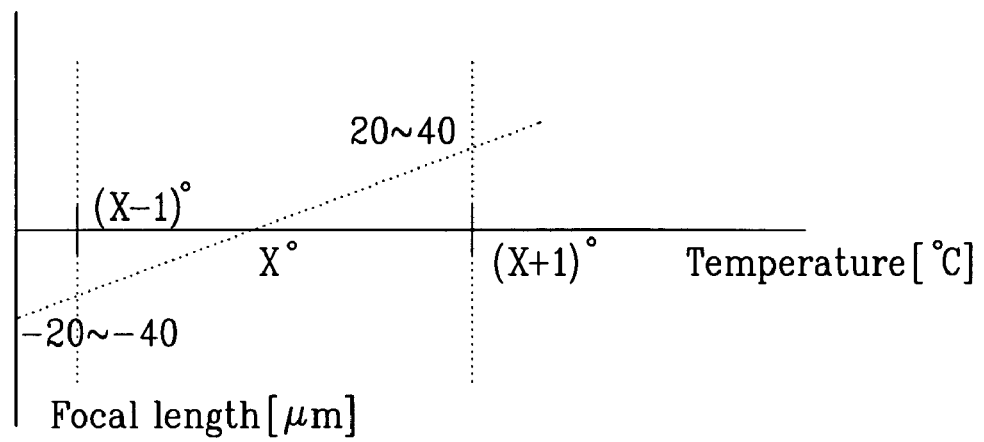
FIG. 3 is a graph illustrating a relationship between temperature variation and focal length variation measured at a projection lens in FIG. 2.
Figure 4:
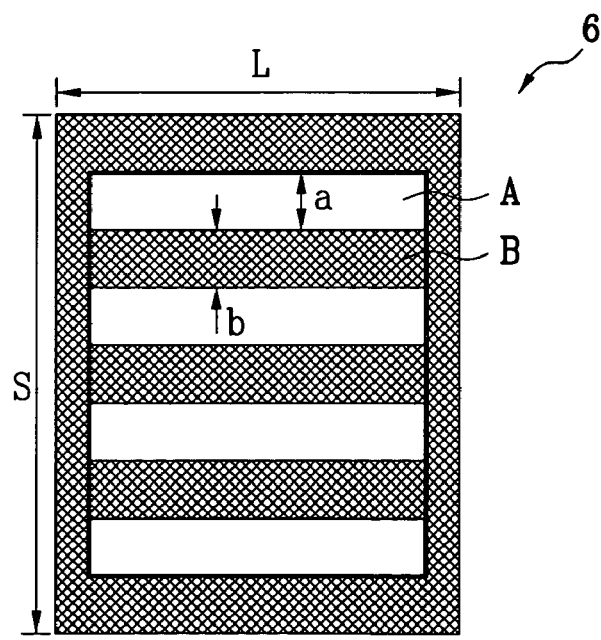
FIG. 4 is a plan view illustrating a laser beam pattern mask for application of a laser beam.
Figure 5:
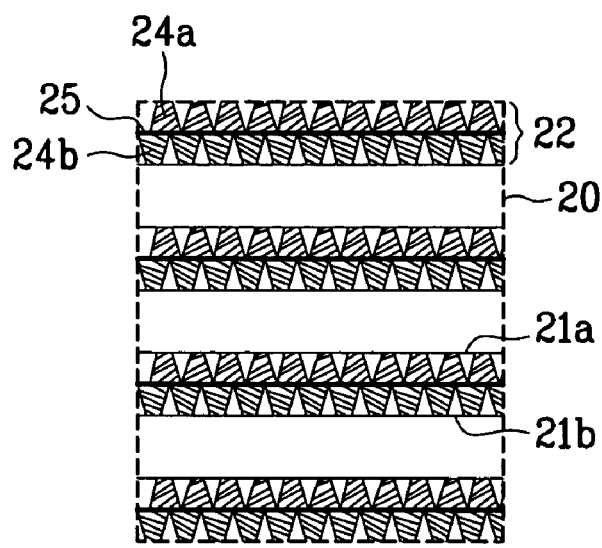
FIG. 5 is a view illustrating a crystallized area formed by one time application of the laser beam by using the laser beam pattern mask in FIG. 4.
Figure 6:
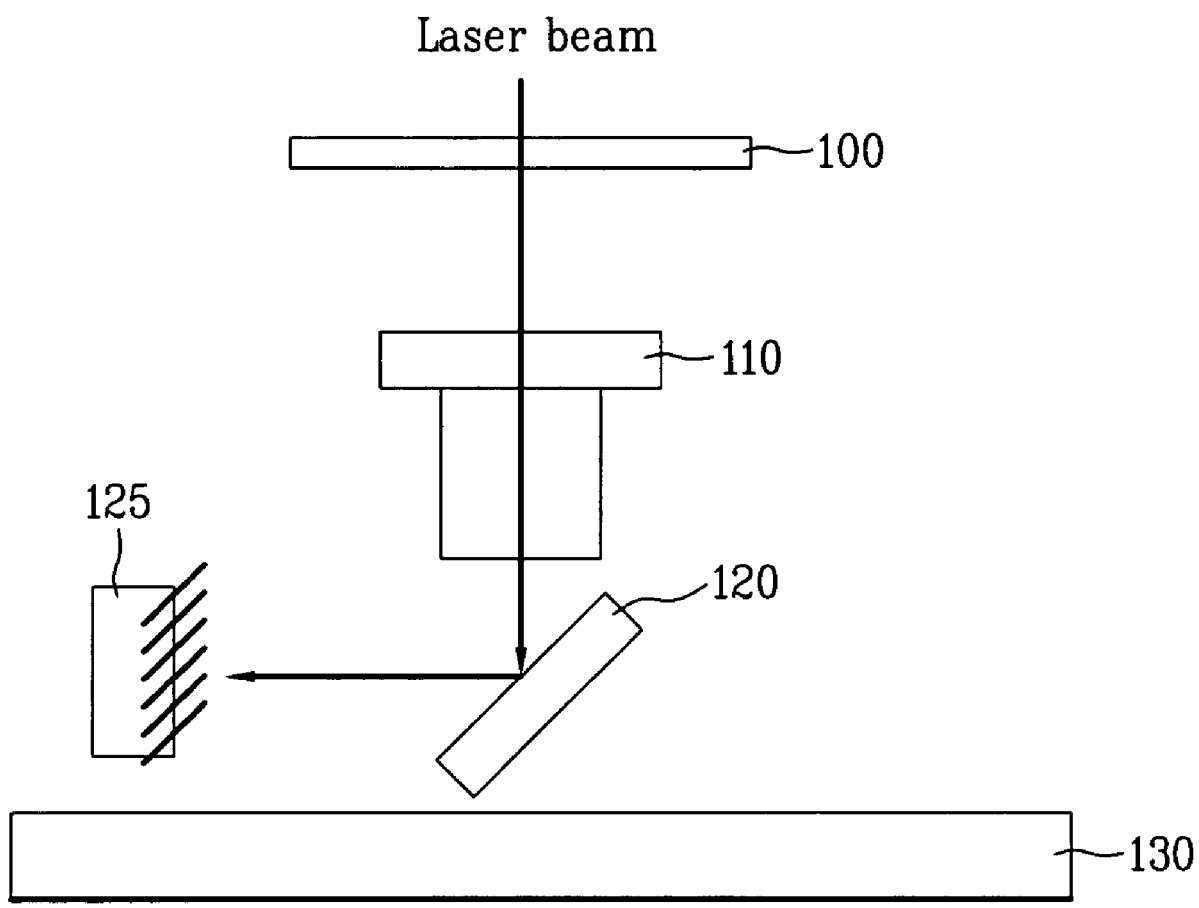
FIG. 6 is a view schematically illustrating a silicon crystallizing device in accordance with a first embodiment of the present invention.

FIG. 6 is a view schematically illustrating a silicon crystallizing device in accordance with a first embodiment of the present invention. As shown in FIG. 6, the silicon crystallizing device includes a laser beam source (not shown) for emitting a laser beam, a converging lens (not shown) for converging the laser beam from the laser beam source, a laser beam pattern mask 100 for passing the laser beam converged at the converging lens in a predetermined pattern, a projection lens 110 for reducing the laser beam passed through the laser beam pattern mask 100 at a predetermined ratio and applying the laser beam, a stage 130 for placing a substrate including an amorphous silicon layer deposited thereon to crystallize the amorphous silicon layer by the laser beam from the projection lens 110, a laser beam shutter 120 for deflecting the laser beam from the projection lens 110 to an outside of the substrate at the time of loading/unloading the substrate, and a cooling device 125 for receiving the laser beam deflected by the laser beam shutter 120 so as to sink heat generated from the laser beam received.

The converging lens, the laser beam pattern mask 100, and the projection lens 110 constitute a projector unit for converging the laser beam from the laser beam source, changing a pattern of the laser beam and reducing the laser beam, before the laser beam is directed to the substrate in a predetermined form. While the laser beam may be applied differently for the time the crystallization is progressed from the time the crystallization is not progressed, because the projection lens 110 is at a temperature lower than a temperature at which the projection lens 110 performs regular crystallization at the moment of loading/unloading of the substrate in the crystallization process, the projection lens 110 cannot perform a regular crystallization due to wrong focal length, even if the laser beam is incident on the projection lens 110 at the moment of loading/unloading the substrate.

Accordingly, the silicon crystallizing device in accordance with the first embodiment is designed such that, though the laser beam is kept applied to the projection lens 110 at the time of loading/unloading the substrate until the projection lens 110 reaches to a temperature at which the projection lens 110 performs regular crystallization, the laser beam is made to incident, not on the substrate, but on the cooling device 125 on an outside of the substrate by deflecting a path of the laser beam passed through the projection lens 110 by using the laser beam shutter 120. In other words, the laser beam shutter 120 is opened/closed in response to an external control signal. Thus, when the laser beam shutter 120 is opened, the laser beam shutter 120 lets the laser beam to travel toward the stage 130 from the projection lens 110. On the other hand, when the laser beam shutter 120 is closed, the laser beam shutter 120 cuts off the travel of the laser beam toward the stage 130 from the projection lens 110, and deflects the path of the laser beam toward the cooling device 125.

In this exemplary instance, a substrate loading time period is defined as a time period starting from introduction of a substrate into the stage 130 to a time right before crystallization of the substrate, whereas a substrate unloading time period is defined as a time period starting from a time right after the crystallization of the substrate to a time before introduction of a next substrate into the stage.

The laser beam from the laser beam source has 30~300 Hz triggering. In the silicon crystallizing device of the first embodiment, open/closing signals for the laser beam shutter 120, movement of the stage 130, and a triggering signal for the laser beam are synchronized.

That is, at the same time of loading the substrate on the stage, the laser beam is directed, not to the stage but to the cooling device 125, by the laser beam shutter 120. Similarly, starting from completion of crystallizing the substrate to completion of unloading the substrate, the laser beam from the projection lens 110 is directed, not to the stage, but to the cooling device 125, by the laser beam shutter 120. Thus, the laser beam shutter 120 is closed, while the substrate is loaded/unloaded, and the laser beam shutter 120 is opened, while the substrate is crystallized.

Figure 7:
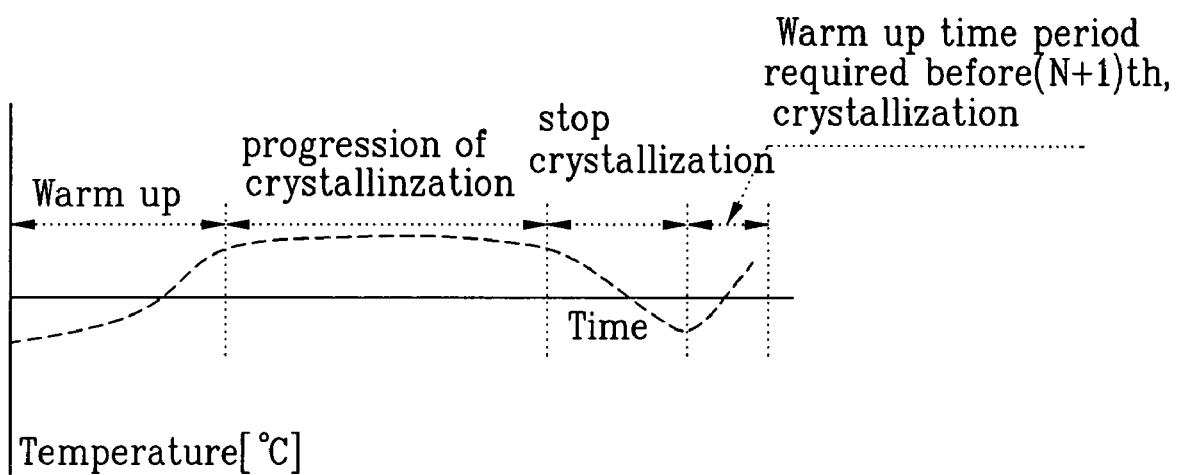
FIG. 7 is a graph illustrating a relationship between temperature variation of a projection lens and progression of crystallization with the silicon crystallizing device of the first embodiment.

FIG. 7 is a graph illustrating a relationship between temperature variation of a projection lens and progression of crystallization with the silicon crystallizing device of the first embodiment. As shown in FIG. 7, since the time before crystallization is before application of the laser beam pattern, the temperature of the projection lens 110 is dependent on a temperature in an environment where the projection lens 110 is located. In general, the environment temperature is substantially lower than the temperature of the projection lens 110 during the crystallization. Since the low temperature of the projection lens 110 affects an initial stage of the crystallization due to wrong focal length, the laser beam is applied to the projection lens 110, but application of the laser beam to the substrate is cut off by the laser beam shutter 120, so that the projection lens 110 performs the crystallization after the projection lens 110 is passed through a preset warming-up time period.

If the crystallization is stopped in a middle stage, the laser beam source detects this occurrence and stops emitting the laser beam. In this exemplary instance, since there is no laser beam pattern incident on the projection lens 110, the projection lens 110 is involved in slow temperature cooling down. Then, at the time of introduction of the next substrate for crystallization, the crystallization is progressed after the projection lens 110 reaches to a preset temperature by the foregoing warming-up step. Meanwhile, after crystallization and unloading of the substrate, the laser beam is emitted from the laser beam source. Also, the laser beam is made such that the projection lens 110 has the laser beam incident thereon as it is, and the laser beam incident on the substrate is cut off by the laser beam shutter 120 so as to prevent the laser beam from being incident on the substrate.

Figure 8:
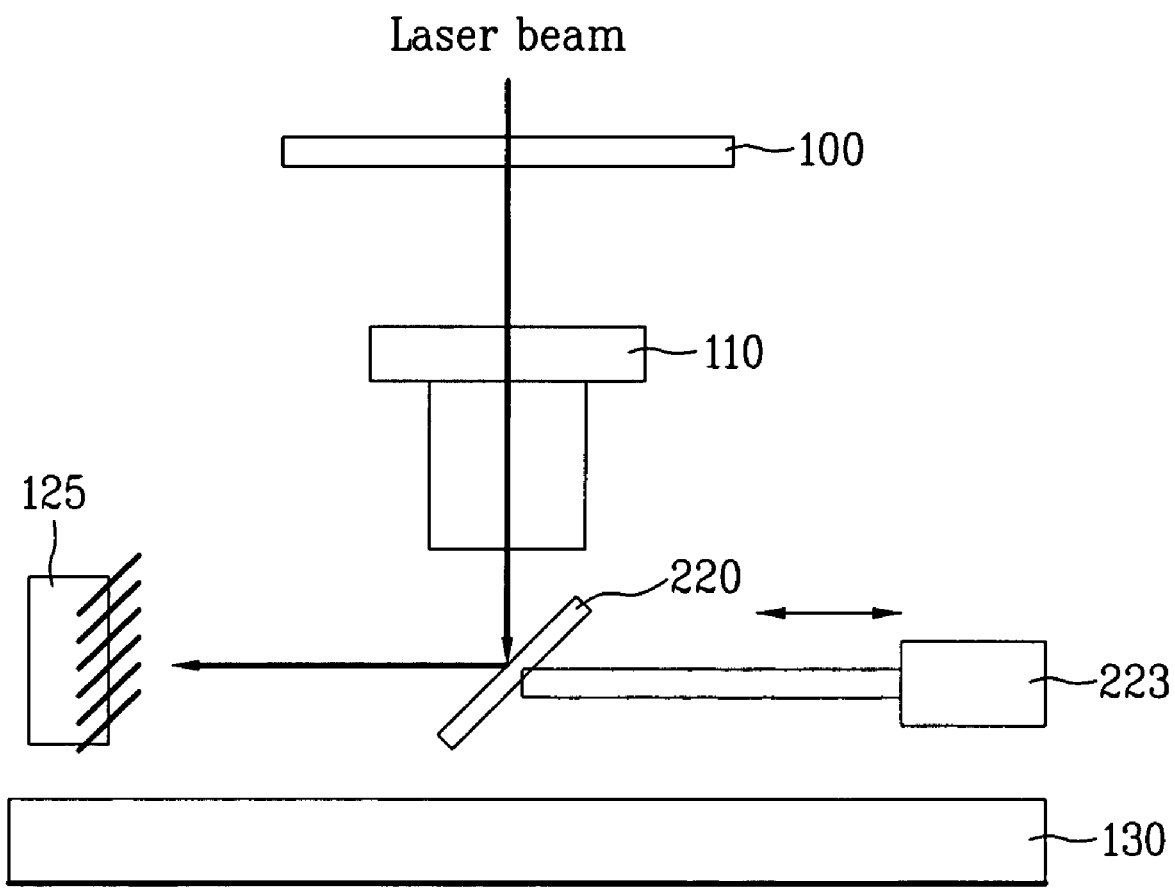
FIG. 8 is a view schematically illustrating a silicon crystallizing device in accordance with a second embodiment of the present invention.

FIG. 8 is a view schematically illustrating a silicon crystallizing device in accordance with a second embodiment of the present invention. As shown in FIG. 8, the silicon crystallizing device includes a laser beam source (not shown) for emitting a laser beam, a converging lens (not shown) for converging the laser beam from the laser beam source, a laser beam pattern mask 100 for passing the laser beam converged at the converging lens in a predetermined pattern, a projection lens 110 for reducing the laser beam passed through the laser beam pattern mask 100 at a predetermined ratio, and applying the laser bean, a stage 130 for placing a substrate including an amorphous silicon layer deposited thereon to crystallize the amorphous silicon layer by the laser beam from the projection lens 110, a mirror 220 for directing the laser beam from the projection lens 110 to an outside of the substrate at the time of loading/unloading the substrate, and a cooling device 125 for receiving the laser beam directed by the mirror 220 to sink heat generated from the laser beam received.

The converging lens, the laser beam pattern mask 100, and the projection lens 110 constitute a projector unit for converging the laser beam from the laser beam source, changing a pattern of the laser beam and reducing the laser beam, before the laser beam is directed to the substrate in a predetermined form. In order to achieve the same object as the foregoing first embodiment, the silicon crystallizing device of the second preferred embodiment is designed such that, though the laser beam is kept applied to the projection lens 110 at the time of loading/unloading the substrate until the projection lens 110 reaches to a temperature at which the projection lens 110 performs regular crystallization, the laser beam is made to incident, not on the substrate but on the cooling device 125 on an outside of the substrate by deflecting a path of the laser beam passed through the projection lens 110 by using the mirror 220.

In this exemplary instance, a substrate loading time period is defined as a time period starting from introduction of the substrate into the stage 130 to a time right before crystallization of the substrate, whereas a substrate unloading time period is defined as a time period starting from a time right after crystallization of the substrate to a time before introduction of the next substrate into the stage.

The laser beam from the laser beam source has 30~300 Hz triggering. In the silicon crystallizing device of the second embodiment, the mirror 220 is positioned under the projection lens 110 during a period of loading/unloading the substrate, and then moved to an outside during regular crystallization. Such a movement of the mirror 220 is realized by moving a cylinder 223 attached to the mirror 220. The movement of the cylinder 223 is synchronized with a movement of the stage 130 at the time of loading/unloading. That is, the laser beam from the projection lens 110 is deflected toward the cooling device 125 by the mirror 220 before the substrate is loaded on the stage, or before a new substrate is loaded after crystallization of the substrate, and the cylinder 223 is moved, thereby moving the mirror 220 to an outside. Thus, a regular laser beam is applied to the substrate in crystallization of the substrate.

Taking the great focal length variation of the projection lens with a temperature variation of the projection lens that forms a micron laser beam pattern in an order of a few μm into account, the silicon crystallizing device of the foregoing exemplary embodiments includes cutting off means such as the laser beam shutter, the mirror or the like, so as to prevent the laser beam from being incident on the substrate at the time the projection lens is involved in temperature variation before or after the regular crystallization. Moreover, the silicon crystallizing device of the foregoing exemplary embodiments is capable of preventing damages by the laser beam applied for warming up the projection lens. As described above, the silicon crystallizing device of the foregoing exemplary embodiments further includes the following advantages.

First, the warming up of the projection lens during a period of loading the substrate on the stage for securing a focal distance at a level for progressing regular crystallization can eliminate non-uniform crystallization caused by variation of the focal length of the projection lens during crystallization. That is, if the projection lens performs crystallization at a temperature below a required temperature, a portion of the substrate, having the laser beam applied thereto within a temperature range before the projection lens reaches to the required temperature after the laser beam is incident thereon, fails to make regular crystallization, to require repetitive application of the laser beam. The exemplary embodiments of the present invention warms up the projection lens in advance, and solves such a problem.

Second, by providing cutting off means, such as the laser beam shutter, the mirror or the like, under the projection lens, a bean overlap region will not be formed on the substrate after regular crystallization. As a result, crystallization characteristics can be maintained securely.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A silicon crystallizing device comprising:
a laser beam source emitting a laser beam;
a projector unit converging and changing a pattern of the laser beam from the laser beam source;
a stage loading or unloading a substrate;
a laser beam shutter deflecting the laser beam from the projector unit to cut off travel of the laser beam toward the stage from the projector unit during a period between a time of starting introduction of the substrate into the stage and a time of starting crystallization of the substrate, or during a period between a time of completing the crystallization of the substrate and a time of starting introduction of a next substrate into the stage; and
a cooling device receiving the laser beam deflected by the laser beam shutter and sinking heat generated from the laser beam;
wherein the projector unit includes:
a converging lens converging the laser beam emitted from the laser beam source,
a laser beam pattern mask passing the laser beam converged through the converging lens in a pattern, and
a projection lens reducing the laser beam passed through the laser beam pattern mask at a ration;
wherein the projection lens is warmed up by application of the laser beam to the projection lens up to a temperature at which the projection lens performs regular crystallization during the substrate loading time period defined as a time period starting from introduction of a substrate into the stage to a time right before crystallization of the substrate.

2. The device as claimed in claim 1, wherein a control signal for the laser beam shutter, a move signal for the stage, a triggering signal for the laser beam are synchronized in application;
wherein the control signal includes an open signal that opens the laser beam shutter to let the laser beam travel toward the stage;
wherein the control signal includes a close signal that closes the laser beam shutter to deflect the laser beam toward the cooling device;
wherein the control signal includes a close signal that closes the laser beam shutter to deflect the laser beam toward the cooling device; and
wherein the close signal is applied to the laser beam shutter at the time of loading/unloading the substrate.

3. A silicon crystallizing device comprising:
a laser beam source emitting a laser beam;
a projector unit converging and changing a pattern of the laser beam from the laser beam source;
a stage loading or unloading a substrate;
a mirror deflecting the laser beam from the projector unit to cut off travel of the laser beam toward the stage from the projector unit during a period between a time of starting introduction of the substrate into the stage and a time of starting crystallization of the substrate, or during a period between a time of completing the crystallization of the substrate and a time of starting introduction of a next substrate into the stage; and
a cooling device receiving the laser beam deflected by the mirror and sinking heat generated by the laser beam;
wherein the projector unit includes:
a converting lens converging the laser beam emitted from the laser beam source,
a laser beam pattern mask passing the laser beam converged through the converging lens in a pattern, and
a projection lens reducing the laser beam passed through the laser beam pattern mask at a ratio;
wherein the projection lens is warmed up by application of the laser beam to the projection lens up to a temperature at which the projection lens performs regular crystallization during the substrate loading time period defined as a time period starting from introduction of a substrate into the stage to a time right before crystallization of the substrate.

4. The device as claimed in claim 3, wherein the mirror is moved when crystallization of the substrate is started, such that the laser beam is applied to the substrate from the projector unit.

5. The device as claimed in claim 3, further comprising a cylinder for moving the mirror.

6. The device as claimed in claim 5, wherein the cylinder is operated simultaneously with loading/unloading of the substrate on/from the stage.

* * * * *